United States Patent
Kim et al.

(10) Patent No.: US 11,217,778 B2
(45) Date of Patent: Jan. 4, 2022

(54) ELECTRONIC DEVICE COMPRISING LIGHT TRANSMITTING FILM AND METHOD FOR MANUFACTURING LIGHT TRANSMITTING FILM

(71) Applicant: Samsung Electronics Co., Ltd., Gyeonggi-do (KR)

(72) Inventors: Hyung-In Kim, Gyeongsangbuk-do (KR); Seong-Ho Jeong, Gyeongsangbuk-do (KR); Hyoung-Jun Go, Incheon (KR); Chul-Soo Shin, Gyeongsangbuk-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 352 days.

(21) Appl. No.: 16/475,150

(22) PCT Filed: Jan. 2, 2018

(86) PCT No.: PCT/KR2018/000045
§ 371 (c)(1),
(2) Date: Jul. 1, 2019

(87) PCT Pub. No.: WO2018/124848
PCT Pub. Date: Jul. 5, 2018

(65) Prior Publication Data
US 2019/0334128 A1    Oct. 31, 2019

(30) Foreign Application Priority Data

Jan. 2, 2017  (KR) .......................... 10-2017-0000449

(51) Int. Cl.
*G02F 1/1333* (2006.01)
*G06F 1/16* (2006.01)
(Continued)

(52) U.S. Cl.
CPC .... *H01L 51/5281* (2013.01); *G02F 1/133305* (2013.01); *G02F 1/133308* (2013.01);
(Continued)

(58) Field of Classification Search
CPC ........... G02F 1/133308; G02F 1/13338; G02F 1/133305; H01L 51/0097; H01L 51/56; H01L 27/3269; G06F 1/1637
See application file for complete search history.

(56) References Cited

U.S. PATENT DOCUMENTS

2002/0041968 A1    4/2002   Sada et al.
2010/0078562 A1    4/2010   Dinh et al.
(Continued)

FOREIGN PATENT DOCUMENTS

JP    2002-116318 A       4/2002
JP    2014119547 A    *  6/2014
(Continued)

*Primary Examiner* — Mariceli Santiago
(74) *Attorney, Agent, or Firm* — Cha & Reiter, LLC

(57) ABSTRACT

A light transmitting film formed in an electronic device, according to various embodiments of the present invention, may comprise: a flexible substrate film layer; a photocurable resin layer disposed on one surface of the substrate film layer and having a predetermined pattern formed thereon; a multicoating layer, disposed on one surface of the photocurable resin film layer, which faces at least one sensor disposed in the electronic device and consists of a plurality of layers; at least one printed layer, disposed on one surface of the multicoating layer, which forms a peripheral area of the at least one sensor; and a ink layer disposed on a surface of at least one of the multi-coating layer and the printed layer, the ink layer having light-transmitting characters.

15 Claims, 7 Drawing Sheets

(51) Int. Cl.
  *H01L 51/52* (2006.01)
  *H01L 27/32* (2006.01)
  *H01L 51/00* (2006.01)
  *H01L 51/56* (2006.01)
  *G02B 30/00* (2020.01)

(52) U.S. Cl.
  CPC ........ *G06F 1/1637* (2013.01); *H01L 27/3269* (2013.01); *H01L 51/0097* (2013.01); *H01L 51/56* (2013.01); *G02B 30/00* (2020.01); *G02F 1/133331* (2021.01); *H01L 2251/5338* (2013.01)

(56) References Cited

U.S. PATENT DOCUMENTS

| | | | |
|---|---|---|---|
| 2016/0239118 A1 | 8/2016 | Yoon et al. | |
| 2017/0176787 A1* | 6/2017 | Jia | G02F 1/1368 |
| 2017/0331071 A1* | 11/2017 | Han | B32B 27/06 |
| 2019/0235308 A1* | 8/2019 | Song | G02B 5/3016 |

FOREIGN PATENT DOCUMENTS

| | | | | |
|---|---|---|---|---|
| KR | 10-2009-0123465 A | | 12/2009 | |
| KR | 10-1200451 B1 | | 11/2012 | |
| KR | 20130117101 A | * | 10/2013 | |
| KR | 10-2014-0065155 A | | 5/2014 | |
| KR | 10-2014-0145392 A | | 12/2014 | |
| KR | 10-2015-0132653 A | | 11/2015 | |
| KR | 10-2015-0145211 A | | 12/2015 | |
| WO | WO-2014109257 A1 | * | 7/2014 | ........... G06F 3/0445 |
| WO | WO-2021145231 A | * | 7/2021 | |

\* cited by examiner

ELECTRONIC DEVICE COMPRISING LIGHT TRANSMITTING FILM AND METHOD FOR MANUFACTURING LIGHT TRANSMITTING FILM

CROSS-REFERENCE TO RELATED APPLICATIONS

This application is a U.S. National Stage application under 35 U.S.C. § 371 of an International application filed on Jan. 2, 2018 and assigned application number PCT/KR2018/000045, which claimed the priority of a Korean patent application filed on Jan. 2, 2017 in the Korean Intellectual Property Office and assigned Serial number 10-2017-0000449, the entire disclosure of which is hereby incorporated by reference.

TECHNICAL FIELD

Various embodiments of the disclosure relate to an electronic device including a light-transmitting film and, for example, to an electronic device having a light-transmitting laminated film disposed in a sensor area and a method for manufacturing the same.

BACKGROUND ART

An electronic device refers to a device which performs a specific function corresponding to an installed program, such as a home appliance, an electronic diary, a portable multimedia player, a mobile communication terminal, a tablet PC, an image/sound device, a desktop/laptop computer, a navigation unit for a vehicle, and the like. For example, these electronic devices may output stored information as sounds or images. With the increase of the degree of integration and the popularization of hyper-speed and high-capacity wireless communication, recently, a single mobile communication terminal has various functions. For example, an entertainment function such as a game, a multimedia function such as reproduction of music/moving images, a communication and security function for mobile banking or the like, a scheduling function, an electronic wallet function, etc. are integrated into a single electronic device, in addition to a communication function.

In general, a mobile device such as a cellular phone includes a display panel having a pixel matrix disposed thereon so as to display images, and a cover window for protecting the display panel. The display panel may include an LCD panel or an OLED panel. The user can see images displayed on the display panel through the cover window. The cover window may include a transparent portion corresponding to the display portion of the display panel and an opaque portion corresponding to the non-display portion of the display panel.

The transparent portion of the cover window is made of a transparent material, while the opaque portion of the cover window is made of an opaque material such that the wire (metal electrode) of the display panel or other components thereof are invisible to the naked eye from the outside. The opaque portion is also referred to as a bezel area.

In general, a printed layer is disposed in the bezel area of the cover window, and components such as a camera, an LED display lamp, and/or a sensor are disposed therein. The printed layer is implemented such that various colors are exhibited while maintaining the transmittance of light provided to a component such as a sensor.

DETAILED DESCRIPTION OF THE INVENTION

Technical Problem

The prior art has a problem in that the front portion inside an electronic device has various sensors disposed thereon and has multiple hole structures formed thereon to be able to sense the sensors, thereby degrading the design value of the outer surface of the electronic device.

In addition, if a color implementation layer is maintained such that the various sensors are invisible to the user's field of view, the optical transmittance necessary for operations of the sensors is not secured, thereby failing to ensure accurate operations of the sensors.

An electronic device according to an embodiment of the disclosure has a color implementation layer maintained intact in an area having a sensor disposed therein such that any sensor hole structure is invisible to the user's field of view from outside the electronic device, thereby providing an aesthetic design.

In addition, according to an embodiment, a light-transmitting film including an ink layer that ensures an optical transmittance required by sensors is implemented, thereby minimizing loss of light that reaches the sensors.

In addition, according to an embodiment, a light-transmitting film that protects the color implementation layer is implemented such that an electronic device which has durability, and the outer surface of which is not discolored, is implemented.

Technical Solution

A light-transmitting film formed on an electronic device according to an embodiment of the disclosure may include: a flexible substrate film layer; a photocurable resin layer disposed on a surface of the substrate film layer, a predetermined pattern being formed on the photocurable resin layer; a multicoating layer disposed on a surface of the photocurable resin layer, which faces at least one sensor disposed inside the electronic device, the multicoating layer including a plurality of layers; at least one printed layer disposed on a surface of the multicoating layer, which forms a peripheral area of the at least one sensor; and an ink layer disposed on a surface of at least one of the multicoating layer and the printed layer, the ink layer having light-transmitting characteristics.

An electronic device according to an embodiment of the disclosure may include: a transparent cover including a view area configured to provide a screen to a user and a bezel area formed on a periphery of the view area, which forms at least partially a curved surface; a display device disposed in the view area of the transparent cover, which faces in a first direction; and a light-transmitting film disposed in the bezel area of the transparent cover, which faces in a second direction that is opposite to the first direction.

The light-transmitting film may include: a flexible substrate film layer disposed to face a surface of the bezel area; a photocurable resin layer disposed on a surface of the substrate film layer, a predetermined pattern being formed on the photocurable resin layer; a multicoating layer disposed on a surface of the photocurable resin layer which faces at least one sensor disposed inside the electronic device, the multicoating layer including a plurality of layers; at least one printed layer disposed on at least one surface of the multicoating layer; and an ink layer disposed on a surface of at least one of the multicoating layer and the printed layer, the ink layer having light-transmitting characteristics.

A method for manufacturing a light-transmitting film according to an embodiment of the disclosure may include the processes of: providing a substrate film layer; forming a photocurable resin layer having a predetermined pattern formed on a surface of the substrate film layer; forming a multicoating layer, including a plurality of layers, on a surface of the photocurable resin layer, which faces a sensor disposed inside the electronic device; forming at least one printed layer in a partial area of the multicoating layer; and forming an ink layer in an area other than the partial area of the multicoating layer and on a surface of the printed layer.

Advantageous Effects

An electronic device according to various embodiments of the disclosure has a color implementation layer maintained intact in the front area of the electronic device, in which sensors are disposed, without etching the same such that sensor hole structures are invisible to the user's field of view from outside the electronic device, thereby providing an aesthetic design.

An electronic device according to various embodiments of the disclosure implements a light-transmitting film including an ink layer that guarantees an optical transmittance required by sensors, thereby minimizing loss of light that reaches the sensors.

An electronic device according to various embodiments of the disclosure implements a light-transmitting film that protects the color implementation layer, thereby making it possible to provide an electronic device which has durability, and the outer surface of which is not discolored.

An electronic device according to various embodiments of the disclosure does not require separate masking and delaminating processes for protecting the color implementation layer, thereby reducing costs and simplifying processes.

MODE FOR CARRYING OUT THE INVENTION

Figure 1:
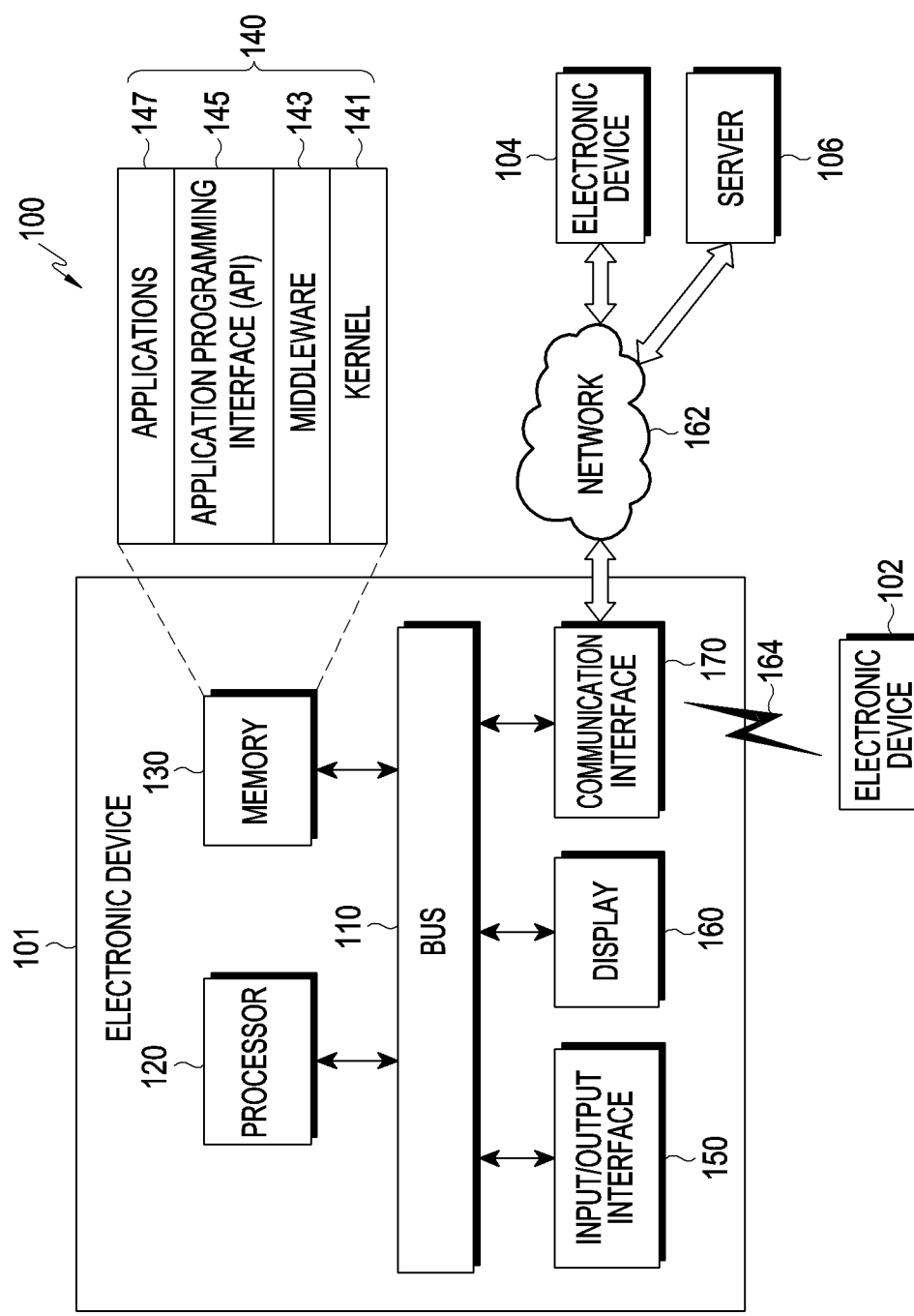
FIG. 1 is a schematic diagram illustrating an electronic device inside a network environment according to an embodiment of the disclosure.

Hereinafter, various embodiments of the disclosure will be described with reference to the accompanying drawings.

The embodiments and the terms used therein are not intended to limit the technology disclosed herein to specific forms, and should be understood to include various modifications, equivalents, and/or alternatives to the corresponding embodiments. In describing the drawings, similar reference numerals may be used to designate similar elements. A singular expression may include a plural expression unless the context clearly indicates otherwise. In the disclosure, the expression "A or B" or "at least one of A and/or B" may include all possible combinations of items enumerated together. The expression "a first", "a second", "the first", or "the second" may modify corresponding elements regardless of the order or the importance thereof, and are used merely to distinguish each element from the others without unduly limiting the elements. When an element (e.g., first element) is referred to as being "(functionally or communicatively) connected", or "coupled" to another element (second element), the element may be connected directly to said another element or connected to the another element through yet another element (e.g., third element).

In the disclosure, the expression "configured to" may be used interchangeably with, for example, "suitable for", "having the capacity to", "adapted to", "made to", "capable of", or "designed to" in terms of hardware or software, according to circumstances. In some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a general-purpose processor (e.g., Central Processing Unit (CPU) or Application Processor (AP)) that can perform the corresponding operations by executing one or more software programs stored in a memory device.

An electronic device according to various embodiments of the disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), an MPEG-1 audio layer-3 (MP3) player, a medical device, a camera, and a wearable device. The wearable device may include at least one of an accessory type (e.g., a watch, a ring, a bracelet, an anklet, a necklace, glasses, a contact lens, or a Head-Mounted Device (HMD)), a fabric or clothing integrated type (e.g., an electronic clothing), a body-mounted type (e.g., a skin pad, or tattoo), and a bio-implantable type (e.g., an implantable circuit). In some embodiments, the electronic device may include at least one of, for example, a television, a Digital Video Disk (DVD) player, an audio player, a refrigerator, an air conditioner, a vacuum cleaner, an oven, a microwave oven, a washing machine, an air cleaner, a set-top box, a home automation control panel, a security control panel, a media box (e.g., Samsung HomeSync™, Apple TV™, or Google Tv™, a game console (e.g., Xbox™ and PlayStation™), an electronic dictionary, an electronic key, a camcorder, and an electronic photo frame.

In other embodiments, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, a scanning machine, and an ultrasonic machine), a navigation device, a Global Navigation Satellite System (GNSS), an Event Data Recorder (EDR), a Flight Data Recorder (FDR), a Vehicle Infotainment Device, electronic devices for a ship (e.g., a navigation device for a ship, a gyro-compass, etc.), avionics, a security device, an automotive head unit, a robot for home or industry, a drone, an Automatic Teller's Machine (ATM) in banks, Point Of Sales (POS) device in a shop, and Internet-of-things devices (e.g., a light bulb, various sensors, a sprinkler device, a fire alarm, a thermostat, a streetlamp, a toaster, athletic equipment, a hot water tank, a heater, a boiler, etc.). According to some embodiments, an electronic device may include at least one of furniture, a part of a building/structure or car, an electronic board, an electronic signature receiving device, a projector, and various types of measuring instruments (e.g., a water meter, an electric meter, a gas meter, a radio wave meter, etc.). In various embodiments, the electronic device may be flexible, or may be a combination of two or more of the above-described various devices. The electronic device according to embodiments of the disclosure is not limited to the above-described devices. In the disclosure, the term "user" may indicate a person who uses an electronic device or a device (e.g., an artificial intelligence electronic device) using an electronic device.

Referring to FIG. 1, an electronic device 101 within a network environment 100 according to various embodiments will be described. The electronic device 101 may include a bus 110, a processor 120, a memory 130, an input/output interface 150, a display 160, and a communication interface 170. In some embodiments, the electronic device 101 may omit at least one of the elements, or may further include other elements. The bus 110 may include, for example, a circuit that interconnects the elements 110 to 170 and transmits communication (for example, control messages or data) between the elements. According to various embodiments of the disclosure, the processor 620 and 655 may include one or more of a central processing unit, an application processor, and a communication processor (CP). The processor 120, for example, may carry out operations or data processing relating to control and/or communication of at least one other element of the electronic device 101.

The memory 130 may include volatile and/or non-volatile memory. The memory 130 may store, for example, instructions or data relevant to at least one other element of the electronic device 101. According to an embodiment, the memory 130 may store software and/or a program 140. The program 140 may include a kernel 141, middleware 143, an Application Programming Interface (API) 145, and/or application programs (or "applications") 147. At least some of the kernel 141, the middleware 143, and the API 145 may be referred to as an operating system. The kernel 141 may control or manage system resources (for example, the bus 110, the processor 120, or the memory 130) used for executing an operation or function implemented by other programs (for example, the middleware 143, the API 145, or the application 147). Furthermore, the kernel 141 may provide an interface via which the middleware 143, the API 145, or the application programs 147 may access the individual elements of the electronic device 101 to control or manage system resources.

The middleware 143 may function as, for example, an intermediary for allowing the API 145 or the application programs 147 to communicate with the kernel 141 to exchange data. Furthermore, the middleware 143 may process one or more task requests, which are received from the application programs 147, according to priorities thereof. For example, the middleware 143 may assign priorities for using the system resources (for example, the bus 110, the processor 120, the memory 130, or the like) of the electronic device 101 to one or more of the application programs 147, and may process the one or more task requests. The API 145 is an interface used by the application 147 to control a function provided from the kernel 141 or the middleware 143, and may include, for example, at least one interface or function (for example, an instruction) for a file control, a window control, image processing, a character control, or the like. For example, the input/output interface 150 may forward instructions or data, input from a user or an external device, to the other element(s) of the electronic device 101, or may output instructions or data, received from the other element(s) of the electronic device 101, to the user or the external device.

The display 160 may include, for example, a Liquid Crystal Display (LCD), a Light Emitting Diode (LED) display, an Organic Light Emitting Diode (OLED) display, a Micro Electro Mechanical System (MEMS) display, or an electronic paper display. The display 160 may display, for example, various types of content (e.g., text, images, videos, icons, and/or symbols) for a user. The display 160 may include a touchscreen and may receive, for example, a touch, gesture, proximity, or hovering input using an electronic pen or the user's body part. The communication interface 170, for example, may set communication between the electronic device 101 and an external device (e.g., a first external electronic device 102, a second external electronic device 104, or a server 106). For example, the communication interface 170 may be connected to a network 162 through wireless or wired communication to communicate with the external device (for example, the second external electronic device 104 or the server 106).

The cellular communication may include, for example, at least one of Long Term Evolution (LTE), LTE-Advance (LTE-A), Code Division Multiple Access (CDMA), Wideband CDMA (WCDMA), Universal Mobile Telecommunications System (UMTS), WiBro (Wireless Broadband), Global System for Mobile Communications (GSM), etc. According to an embodiment, the wireless communication may include, for example, at least one of Wi-Fi (Wireless Fidelity), Bluetooth, Bluetooth low energy (BLE), ZigBee, near field communication (NFC), magnetic secure transmission, Radio Frequency (RF), and body area network (BAN). According to an embodiment, the wired communication may include GNSS. The GNSS may be, for example, a global positioning system (GPS), a global navigation satellite system (Glonass), a Beidou navigation satellite system (hereinafter, referred to as "Beidou"), or Galileo (the European global satellite-based navigation system). Hereinafter, in this document, the term "GPS" may be interchangeable with the term "GNSS". The wired communication may include, for example, at least one of a Universal Serial Bus (USB), a High Definition Multimedia Interface (HDMI), Recommended Standard 232 (RS-232), power line communication, a Plain Old Telephone Service (POTS), and the like. The network 162 may include a telecommunications network, for example, at least one of a computer network (for example, a LAN or a WAN), the Internet, and a telephone network.

Each of the first and second external electronic devices 102 and 104 may be of a type identical to or different from that of the electronic device 101. According to various embodiments, all or some of the operations executed in the electronic device 101 may be executed in another electronic device or a plurality of electronic devices (for example, the electronic devices 102 and 104 or the server 106). According to an embodiment, when the electronic device 101 has to perform some functions or services automatically or in response to a request, the electronic device 101 may make a request for performing at least some functions relating thereto to another device (for example, the electronic device 102 or 104 or the server 106) instead of performing the functions or services by itself or in addition. Another electronic device (for example, the electronic device 102 or 104, or the server 106) may execute the requested functions or the additional functions, and may deliver a result of the execution to the electronic device 101. The electronic device 101 may provide the received result as it is, or may additionally process the received result to provide the requested functions or services. To this end, for example, cloud-computing, distributed-computing, or client-server-computing technology may be used.

Figure 2A:
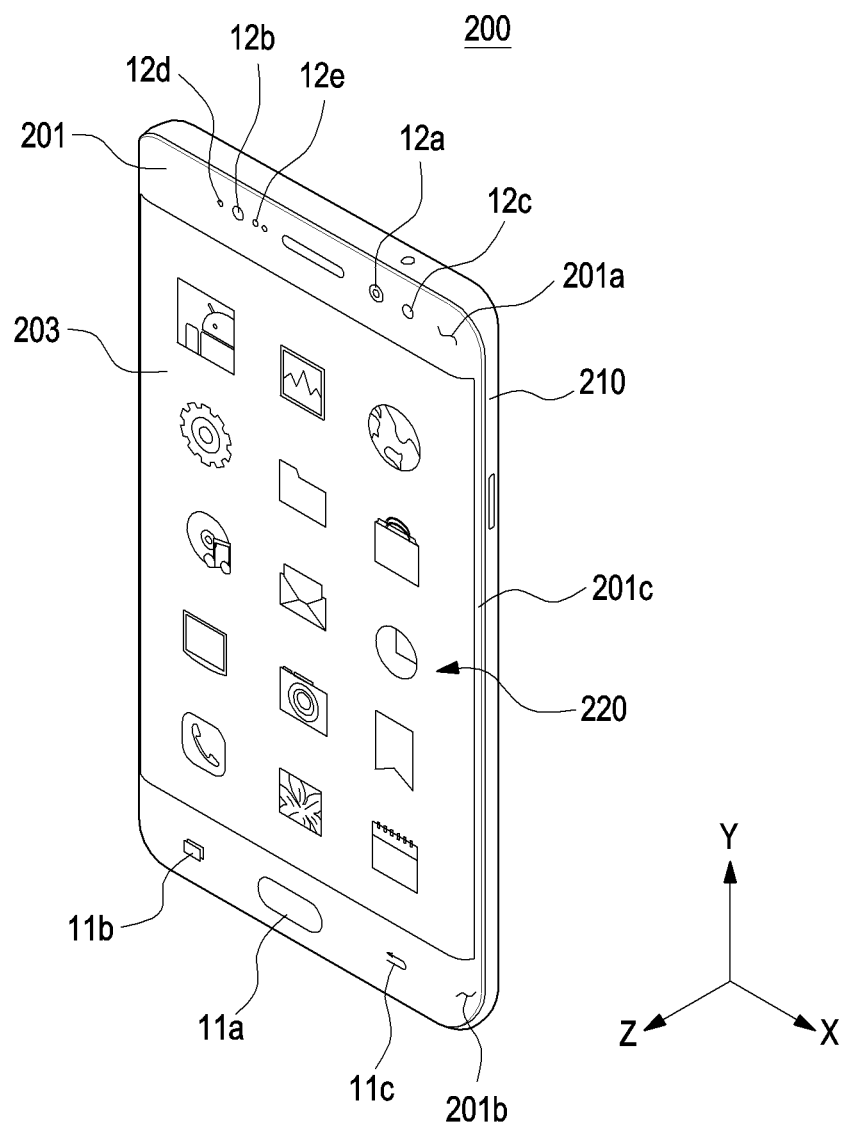
FIG. 2A is a front view illustrating an electronic device 200 according to one of various embodiments of the disclosure.
Figure 2B:
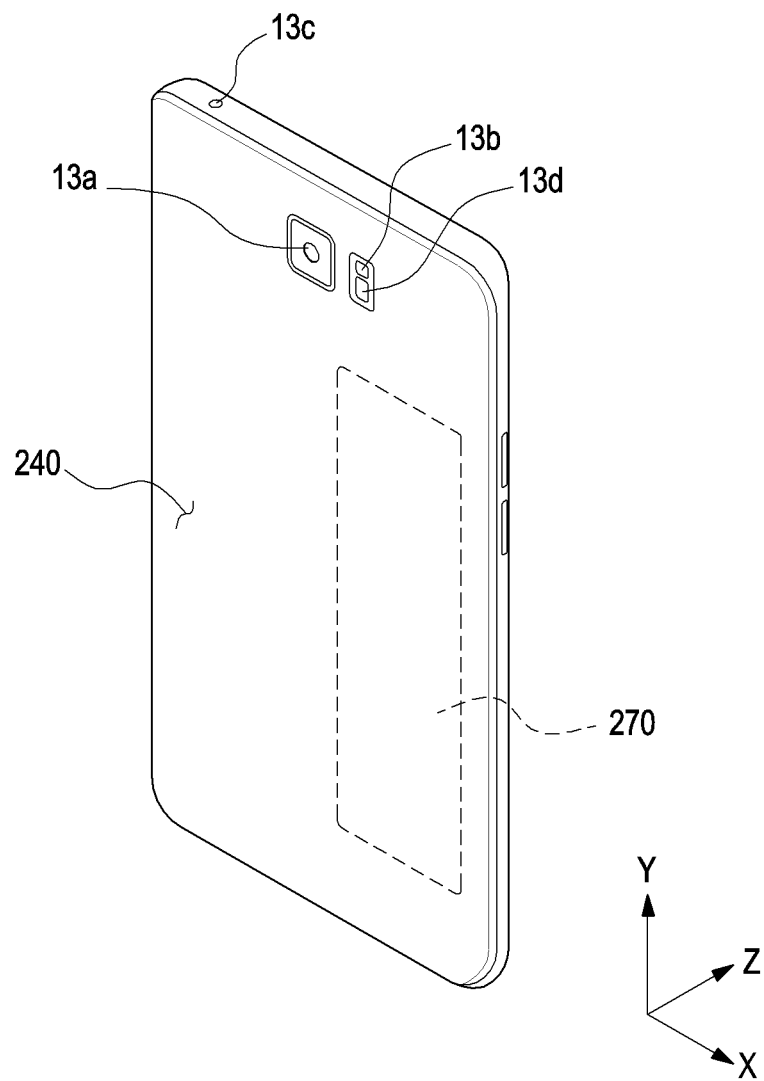
FIG. 2B is a rear view illustrating the electronic device 200 according to one of various embodiments of the disclosure, seen in a different direction.

FIG. 2A is a perspective view illustrating an electronic device 200 according to one of various embodiments of the disclosure. FIG. 2B is an exploded perspective view illustrating the electronic device 200 according to one of various embodiments of the disclosure, seen in a different direction.

In FIG. 2A and FIG. 2B, "X" of the three-axis orthogonal coordinate system may correspond to the width direction of the electronic device 200, "Y" may correspond to the longitudinal direction of the electronic device 100, and "Z" may correspond to the thickness direction of the electronic device 200. The "first direction (+Z)" used to describe various embodiments of the disclosure may refer to a direction perpendicular to a surface of the transparent plate 203, and the "second direction (−Z)" may refer to the opposite direction of the "first direction (+Z)".

As illustrated in FIG. 2A and FIG. 2B, the electronic device 200 may include a housing 210 and a display device 220. The front surface of the housing 210 may be open, and a transparent cover 203 may be mounted so as to form at least a part of the front surface 201 of the housing 210 such that the open front surface 201 of the housing 210 can be covered.

According to various embodiments, the transparent cover 203 may be disposed on the front surface so as to face in the first direction (+Z) of the housing 210. The transparent cover 203 may be made of a transparent material, such as glass or resin (for example, acrylate or polycarbonate) so as to implement a screen output from a display device (for example, the display 160 of FIG. 1). The electronic device 200 may have a keypad provided on the front surface 201 of the housing 210, for example, in one area of the transparent cover 203, the keypad including mechanically operated buttons or touch keys 11a, 11b, and 11c. The touch keys may provide an input signal by means of the user's physical contact. According to various embodiments, the keypad may be implemented by mechanical buttons only, or by the touch keys only. As another example, the keypad may be implemented as a combination of a mechanical button type and a touch type. In addition, the keypad may variously provide screens expressed on the display device in response to long pressing or short pressing of the buttons or in response to the touch time. According to an embodiment, the keypad may include a home button 11a, and the home button 11a may be configured by a mechanical button that generates an input signal in response to the user's physical input, or by a touch button that generates an input signal in response to the touch's contact (for example, a touch).

Inside the housing 210, various circuit devices described with reference to FIG. 1, such as the processor 120, the memory 130, the input/output interface 150, and the communication interface 170, may be contained, and a battery 270 may also be contained therein so as to secure a power supply.

According to various embodiments of the disclosure, the upper-end area 201a of the front surface of the electronic device 200 may include a first camera 12a, a light source portion 12b, or an iris camera 12c. For example, the light source portion 12b may an IR LED, and the iris camera 12c may take an image of the user's eye by using red near-infrared rays coming from the IR LED as a light source, thereby recognizing iris information. As another example, the upper-end area 201a of the front surface of the electronic device 200 may include a light source portion indicator lamp 12d and a luminance sensor or a proximity sensor 12e. In another example, the rear surface 240 of the electronic device 200 may include a second camera 13a and a heart rate monitor (HRM) 13d or a flash 13b, and the upper portion of the electronic device 200 may include a microphone 13c.

According to various embodiments, the housing 210 may be made of a metal material. According to various embodiments of the disclosure, a part (for example, edge) of the housing 210 may be made of a metal material, and another part of the housing 210 may be made of a plastic material.

According to various embodiments, the front area 201 of the housing 210 may be configured by the transparent cover 203, and may be divided into a view area in which the display device 220 is disposed and a bezel area on the periphery of the view area, in which a light-transmitting film (the light-transmitting film 300 of FIG. 5) is disposed. According to an example, the bezel area may include an upper-end area 201a disposed in the +Y-axis direction with reference to the display device 220, a lower-end area 201b disposed in the Y-axis direction, and a side area 201c disposed in the X-axis direction. A light-transmitting film may be disposed in the lower portion of the front area 201. For example, the light-transmitting film may be disposed between the upper-end area 201a and components disposed inside the upper-end area, such as the sensor 12e and the cameras 12a and 12c, such that wavelengths in a predetermined band can be transmitted while protecting the sensor 12e and the cameras 12a and 12c. The light-transmitting film will be described later in more detail.

According to various embodiments, a surface of the housing 210 formed in the second direction (−Z) may form the rear cover 240 of the housing 210. The rear cover 240 may be made of a glass material or a reinforced plastic material.

Figure 3:
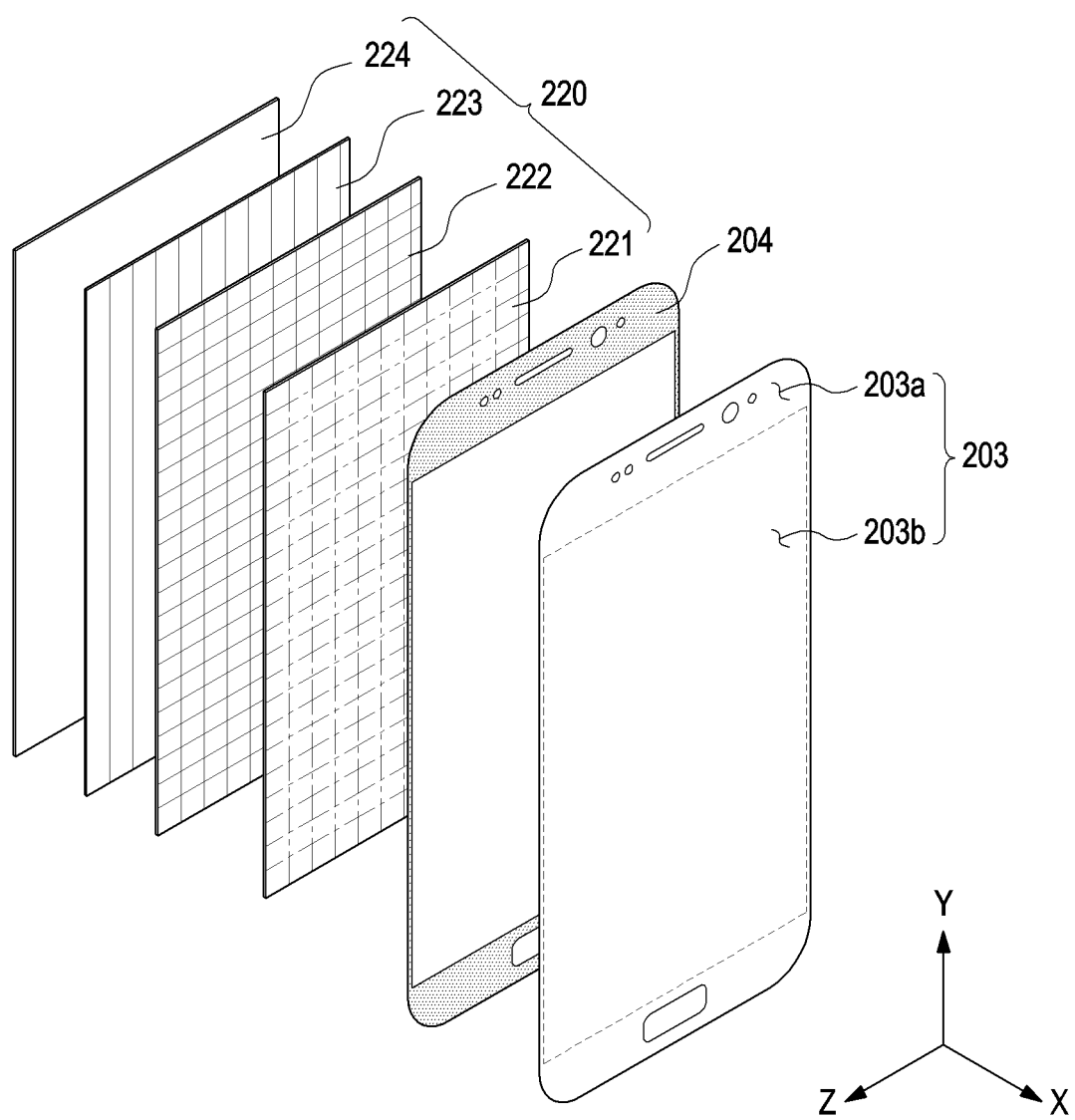
FIG. 3 is an exploded perspective view successively enumerating a transparent cover 203 and a display device 220 according to various embodiments of the disclosure.

FIG. 3 is an exploded perspective view successively enumerating a transparent cover 203 and a display device 220 according to various embodiments of the disclosure. The transparent cover 203 and the display device 220 of the electronic device illustrated in FIG. 3 may have the same structures as those of the transparent cover 203 and the display device 220 of the electronic device 200 illustrated in FIG. 2.

Referring to FIG. 3, the electronic device 200 may include a transparent cover 203 that forms the outer surface thereof and a display device 220 laminated/disposed inside the transparent cover 203. The transparent cover 203 may include a view area 203a that provides the user with a display device and a bezel area 203b having a light-transmitting film 204 disposed on the periphery of the view area. The display device 220 may be disposed to face a surface of the view area 203a.

According to various embodiments, the display device 220 may include a liquid crystal display (LCD), a light-emitting diode (LED) display, an organic light-emitting diode (OLED) display, a microelectromechanical system (MEMS) display, or an electronic paper display. The display device 220 may have a touchscreen panel integrated therewith such that the same can perform a touchscreen function. According to various embodiments of the disclosure, the display device 220 may have an antenna radiator mounted on the inner or outer surface thereof such that the same can perform a wireless communication function.

According to various embodiments, the display device 220 may be electrically connected to a display circuit board (not illustrated), and the display circuit board may be disposed inside the housing (the housing 210 of FIG. 1). The display circuit board may transfer an electric signal for driving the display device 240.

According to various embodiments, the display device 220 may have an organic light-emitting diode (OLED) disposed on a plastic material (for example, polyimide) such that the same is used as a flexible substrate. For example, the display device 220 may include a substrate layer 224 made of a plastic material, a thin film transistor (TFT) 223, an organic light-emitting layer 222, and a polarizing film 221.

According to various embodiments, the substrate layer 224 may be made of a flexible plastic material, and the transistor 223 may be laminated on a surface of the substrate layer 224 while being electrically connected to the multiple electrodes. The transistor 223 may include a gate electrode, a source electrode, and a drain electrode.

According to an embodiment, an organic light-emitting layer 222 may be laminated on a surface of the transistor 223, an organic light-emitting diode including R, G, or B pixels being disposed on the organic light-emitting layer 222, and an optical member layer 221 may be laminated on a surface of the organic light-emitting layer 222.

According to various embodiments, at least one optical member layer 221 may be laminated on the display device 220 so as to transmit the screen output from the display device 220. Accordingly, the optical member layer 221 may be directly attached to the display device 220 or bonded to another optical member on the display device 400. For example, the optical member layer 221 may include an optical compensation film or the like for compensating for the phase difference or the like of the screen output from the display device 220. The optical compensation film may include, for example, a polarizing film. The optical compensation film may be configured by attaching tri-acetyl cellulose (TAC) films to both surfaces of a polyvinyl alcohol (PVA) film that provides a polarizing function, respectively, such that the TAC film on the outer surface is protected by an outer-surface coating layer.

Referring back to FIG. 3, a bezel area 203b may be provided on the edge of the view area 203a of the transparent cover 203 such that a light-transmitting film 204 is disposed therein. The light-transmitting film 203b may include a plurality of layers and may be disposed in the upper-end area, lower-end area, and side area of the electronic device 200.

According to various embodiments, the transparent cover 203 may be disposed in the first direction (+Z) of the light-transmitting film 204 disposed in the bezel upper-end area, and a camera and a sensor (the cameras 12a and 12c and proximity/luminance sensor 12e of FIG. 2) may be disposed in the second direction (−Z) that is opposite to the first direction (+Z).

Hereinafter, the light-transmitting film 204 disposed in the bezel upper-end area 203a will be described.

Figure 4:
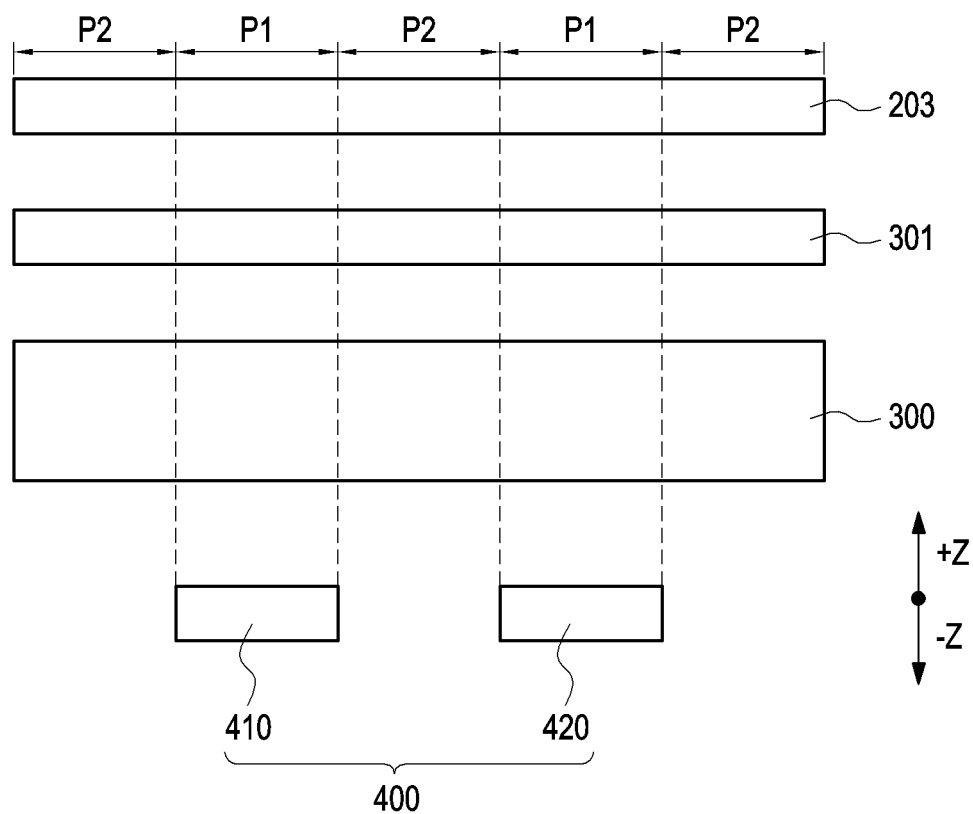
FIG. 4 is a schematic diagram illustrating an arrangement relationship between a transparent cover 203 and a light-transmitting film 300 of an electronic device 200 according to one of various embodiments of the disclosure.

FIG. 4 is a schematic diagram illustrating an arrangement relationship between a transparent cover 203 and a light-transmitting film 300 of an electronic device according to one of various embodiments of the disclosure. The transparent cover 203 and the light-transmitting film 300 of the electronic device illustrated in FIG. 4 may have the same structures as those of the transparent cover 203 and the light-transmitting film 204 of the electronic device 200 illustrated in FIG. 3.

Referring to FIG. 4, the electronic device may include an adhesive layer 301, a light-transmitting film 300, and at least one sensor 400 toward the second direction (−Z) with reference to the transparent cover 203. The area in which the transparent cover 203, the adhesive layer 301, the light-transmitting film 300, and the at least one sensor 400 are disposed may include a first area P1 in which the at least one sensor 400 is disposed and a second area P2 other than the first area P1. For example, the first area P1 may be delimited in a circular or elliptical shape, which corresponds to the lens shape of the at least one sensor 400. However, the shape of the first area P1 is not limited thereto, and may have various shapes for guiding the path of light reaching the sensor 400.

According to various embodiments, the transparent cover 203 may form the outer surface of the electronic device, and may be made of a transparent material, such as glass or resin, so as to form a flexible structure. For example, the transparent cover 203 may be made of a flexible material so as to implement a curved configuration that naturally extends from the panel center to the outer sides corresponding to the upper, lower, left, and right sides thereof.

According to various embodiments, the transparent cover 203 may have a thickness determined such that components disposed inside the electronic device, such as the display device, can be protected. The thickness of the transparent cover 203 may be 400 µm to about 700 µm, and may be 500 µm, for example.

According to various embodiments, an adhesive layer 301 may be applied between the transparent cover 203 and the light-transmitting film 300 such that the transparent cover 203 and the light-transmitting film 300 are bonded. The adhesive layer 301 may be formed on the entire surface of the bezel area (for example, the bezel area 203a of FIG. 3).

For example, the transparent cover 203 having the light-transmitting film 300 formed thereon may be manufactured by applying ink to a separate transfer substrate so as to form the light-transmitting film 300, and then transferring the light-transmitting film 300 to the transparent cover 203. In order to transfer the light-transmitting film 300 to the transparent cover 203, the adhesive layer 301 may be formed on the upper portion of the light-transmitting film 300 such that the light-transmitting film 300 is attached to the transparent cover 203 via the same.

According to various embodiments, the adhesive layer 301 may be manufactured by applying, without any limitation, a widely known composition such as a widely known adhesive, an adhesive film, or an optically transparent adhesive layer. For example, the adhesive layer 301 may be manufactured by using an acrylate-based adhesive. As another example, the adhesive layer 301 may include silicon, air, foam, a membrane, optically clear adhesive (OCA), sponge, rubber, ink, or polymer (PC or PET).

According to various embodiments, the adhesive layer 301 may have a thickness determined such that light-transmitting film 300 can be protected. For example, the thickness of the adhesive layer 301 may be 15 µm to 35 µm, and may be 25 µm, for example. A process of transferring the light-transmitting film is made possible by using the adhesive layer 301 having the above range of thickness, and it is accordingly possible to implement a thin transparent cover for a panel, on which the light-transmitting film is formed.

According to various embodiments, the transparent cover 203 to which the light-transmitting film 300 is attached may be formed by a process of transferring the light-transmitting film 300 to a film. According to an embodiment, the light-transmitting film 300 may implement various effects by various methods for implementing various colors desired by the user, and may be manufactured by transferring the light-transmitting film 300, which is prefabricated in this manner, to the transparent cover 203.

According to various embodiments, the light-transmitting film 300 may be disposed in the bezel area (the bezel area 203a of FIG. 2) of the transparent cover 203. For example, the light-transmitting film 300 may be disposed in the upper-end bezel area 203a of the transparent cover 203 and disposed on a path of light transferred to components such as sensors.

According to various embodiments, multiple light-transmitting films 300 may be laminated and formed, and a different layer may be configured for each of the first area P1 or the second area P2 so as to form a different thickness.

According to various embodiments, the light-transmitting film 300 may be made of materials having various colors, such as black ink, white ink, and pink ink, and may be formed by a widely known method using a widely known material. In addition, a stereoscopic appearance of the exhibited color may be provided, and components (for example, sensors) disposed therein are invisible to the user's field of view when seen from outside the electronic device, thereby providing an aesthetic design. The light-transmitting film 300 will be described later in more detail.

According to various embodiments, at least one sensor 400 may be disposed on a surface of the light-transmitting film 300. The sensor 400 may be disposed inside the electronic device, and a lens may be disposed from the second area P2 in the first direction (+Z).

According to various embodiments, the sensor 400 may be one of an acceleration sensor, a gyro sensor, a proximity sensor, a luminance sensor, an RGB sensor, a brightness sensor, a Hall sensor, a motion sensor, a temperature/humidity sensor, a geomagnetic sensor, a heart beat sensor, a fingerprint recognition sensor, a touch recognition sensor, and/or a pressure recognition sensor. For example, the sensor 400 may be a proximity sensor 410 and a luminance sensor 420.

According to various embodiments, the proximity sensor 410 may be a kind of position sensor or displacement sensor capable of detecting the position in response to an approach of an object or a user. The luminance sensor 420 may estimate the luminance according to photosensitivity corresponding to human eyes and may accordingly control the brightness of light. Various photocells and phototubes may be used as the luminance sensor 420.

According to various embodiments, the proximity sensor 410 and the luminance sensor 420 may require an efficient transmittance in an optical wavelength band about 550 nm or 940 nm. Accordingly, a film required to have an efficient transmittance in a wavelength band of about 550 nm or 940 nm may be manufactured and disposed on the light-transmitting film 300 disposed on the proximity sensor 410 and the luminance sensor 420.

Figure 5:
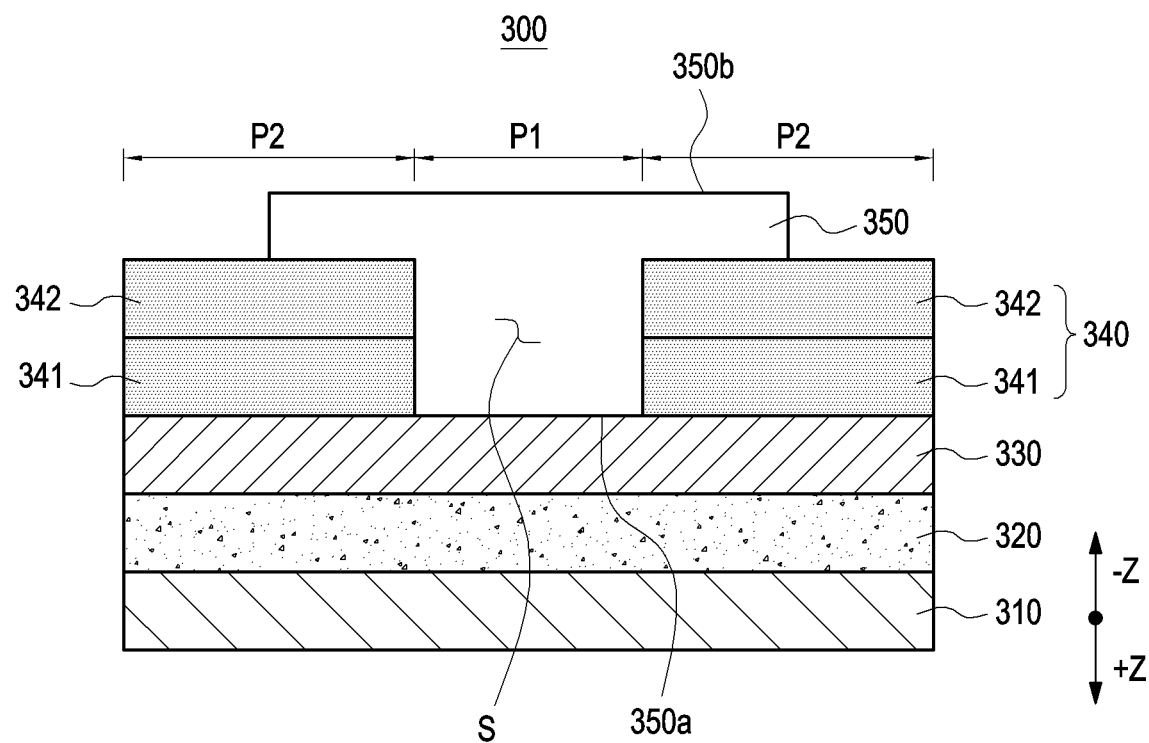
FIG. 5 is a lamination diagram of a light-transmitting film 300 of an electronic device 200 according to one of various embodiments of the disclosure.

FIG. 5 is a lamination diagram of a light-transmitting film 300 of an electronic device according to one of various embodiments of the disclosure. The light-transmitting film 300 of the electronic device illustrated in FIG. 5 may have the same structure as that of the light-transmitting film 300 illustrated in FIG. 4.

Referring to FIG. 5, the light-transmitting film 300 may be configured by laminating a plurality of layers between a transparent cover (the transparent cover 203 of FIG. 4) and at least one sensor (the sensor 400 of FIG. 4). The light-transmitting film 300 may include a substrate film layer 310, a photocurable resin layer 320, a multicoating layer 330, a printed layer 342, and an ink layer 350 laminated/disposed successively toward the second direction (−Z).

According to various embodiments, the substrate film layer 310 may be disposed to face the transparent cover (the transparent cover 203 of FIG. 4) with the adhesive layer (the adhesive layer 301 of FIG. 4) interposed therebetween and may have a high transmittance and flexible characteristics. For example, the substrate film layer 310 may be made of a polymer film such as PET or a glass substrate.

According to various embodiments, the substrate film layer 310 may be substantially disposed entirely in the first area P1 in which the at least one sensor 400 is disposed and in the second area P2 in which the at least one sensor 400 is not disposed. The substrate film layer 310 may be formed to have a thickness of 45 μm to 55 μm, and a thickness of 50 μm, for example.

According to various embodiments, the photocurable resin layer 320 may be disposed on a surface of the substrate film layer 310, may face in the second direction (−Z), and may include multiple micropatterns so as to exhibit a stereoscopic color expression. For example, the photocurable resin layer 320 may be manufactured by a photolithography process, or by an imprint lithography process in the following manner: an inorganic or polymer mold having a desired micropattern formed therein in advance is used to integrate a metal film or an organic film with a curable composition coating formed thereon, and the same are cured by heat or light, thereby forming a pattern.

According to various embodiments, the photocurable resin layer 320 may be crosslinked and/or cured by application of light energy such as ultraviolet (UV) rays. According to an embodiment, the photocurable resin layer 320 exhibits excellent bondability with a substrate, resistance to heat, durability (against high temperature, high pressure, and high humidity), and lower-film protection characteristics, and maintains a high transmittance even after high-temperature treatment such that the same can be usefully applied to form a micropattern and a protective film.

According to various embodiments, the photocurable resin layer 320 may be disposed to face the transparent cover 203 with the substrate film layer 310 interposed therebetween, and may have a high transmittance such that the same can transmit light received from the transparent cover 203. As another example, the photocurable resin layer 320 may have flexible characteristics such that the same can undergo a structure change, so as to correspond to the flexible structure of the transparent cover 203.

According to various embodiments, the photocurable resin layer 320 may include a base resin, a reactive diluent, a photopolymerization initiator, and various additives. For example, the base resin (oligomer) among the additives used for the photocurable resin layer 320 is an important component that determines the physical characteristics of the resin, and may form a polymer bond through a polymerization reaction, thereby forming a hard coating. The base resin may be classified into polyester-based, epoxy-based, urethane-based, polyether-based, and polyacrylate-based acrylates according to the structure of skeletal molecules. As another example, the reactive diluent (monomer) among the additives used for the photocurable resin layer 320 serves as a crosslinker and a diluent of the reactive oligomer, and may form a hard coating through polymerization. As another example, the photopolymerization initiator among the additives used for the photocurable resin layer 320 is the most basic raw material of UV-curable resin. The photopolymerization initiator plays the role of absorbing ultraviolet rays and generating radicals or cations so as to initiate polymerization, and a single material or a mixture of two or three kinds of materials may be used as the same. As another example, a photosensitizer, a colorant, a thickener, and a polymerization inhibitor may be added, according to the usage, as the other additives used for the photocurable resin layer 320. The same may additionally endow the resin with a special ability according to the requirements of the user or the industry.

According to various embodiments, the photocurable resin layer 320 may be substantially disposed entirely in the first area P1 in which the at least one sensor 400 is disposed and in the second area P2 in which the sensor is not disposed.

According to various embodiments, the multicoating layer 330 may be disposed on a surface of the photocurable resin layer 320, may face the second direction (−Z), and may implement a color expressed on the outer surface of the electronic device 200.

According to various embodiments, the multicoating layer 330 may include at least two layers, each of which may be made of a different material. For example, the multicoating layer 330 may include five layers, and each layer may be made of at least one of $SiO_2$, $Nb_2O_5$, $Ta_2O_5$, BST{(Ba,Sr)$TiO_3$}, PZT{Pb(Zr,Ti)$O_3$}, $Al_2O_3$, $HfO_2$, $ZrO_2$, $La_2O_3$, In, $TiO_2$, $Ti_3O_5$, aluminate, and silicate alloy.

According to various embodiments, the multicoating layer 330 may be disposed to face the transparent cover 203 with the photocurable resin layer 320 interposed therebetween, and may have a high transmittance such that the same can transmit light received from the transparent cover 203. As another example, the multicoating layer 330 may have flexible characteristics such that the same can undergo a structure change, so as to correspond to the flexible structure of the transparent cover 203.

According to various embodiments, the multicoating layer 330 may be disposed to contact a different material in each area in which the same is disposed. For example, in the first area P1, a surface of the multicoating layer 330 facing in the second direction (−Z) may be disposed to contact the ink layer 350 and, in the second area P2, another surface of the multicoating layer 330 facing in the second direction (−Z) may be disposed to contact the ink layer 340.

According to various embodiments, because no etching process is performed until the ink layer 350 is formed after the multicoating layer 330 has been formed, the multicoating layer 330 may form a single intact layer in the first area P1 without being damaged. Accordingly, indium among the metal components that constitute the multicoating layer 330 is protected by the ink layer such that the outer surface of the electronic device is not discolored. In addition, the multicoating layer 330 that implements a color is not damaged such that the at least one sensor 400 is invisible from outside the electronic device, thereby providing an aesthetic outer surface of the electronic device. Moreover, additional masking and delaminating processes for performing an etching process are unnecessary, thereby simplifying the processes.

According to various embodiments, the printed layer 340 may be disposed on a surface of the multicoating layer 330, may face in the second direction (−Z), and may prevent the electronic device from undergoing screen bleeding.

According to various embodiments, the printed layer 340 may include at least two layers, and each layer may be made of a different material. For example, the printed layer 340 may include a first printed layer 341 and a second printed layer 342, and the first printed layer 341 and the second printed layer 342 may be disposed to be laminated on each other. According to an embodiment, the first printed layer 341 may be made of a material using black ink, and may be manufactured through a background printing process. The second printed layer 342 may be made of a material using blank ink, and may be manufactured through a shaded printing process.

According to various embodiments, the first printed layer 341 may be disposed on a surface of the multicoating layer 330, and the second printed layer 342 may be laminated/disposed on a surface of the first printed layer 341. The printed layer 340 may be disposed in the second area P2 only, and the first area P1 may have no printed layer 340 disposed therein but have an opening such that a light path is formed. For example, the printed layer 340, which blocks light, may not be disposed on the path of light that reaches the sensor disposed in the first area P1, and may be disposed in the second area P2 only so as to form a light path guide area S in which outer peripheries of the sensors and the ink layer 350 (described later) can be disposed.

According to various embodiments, the ink layer 350 may be disposed on the inner surface of the opening of the printed layer 340 and on a surface thereof facing in the second direction (−Z) so as to surround the same. Accordingly, the ink layer 350 may occupy the first area P1 that is disposed on the same plane with the printed layer 340.

According to various embodiments, the opening of the printed layer 340 is a light path guide area S, and may serve as a passage along which light transferred from the outside is received into the sensor. Accordingly, light provided to the first area P1 may be blocked by the printed layer 340 so as to suppress internal screen bleeding, and light provided to the second area P2 may solely reach the inner sensor area.

According to various embodiments, the ink layer 350 is disposed on a partial surface of the multicoating layer 330 and/or the printed layer 342 so as to face in the second direction (−Z), and may efficiently transmit light in a specific wavelength band such that the same reaches the at least one sensor 400.

According to various embodiments, the ink layer 350 may include infrared dried ink, and may be implemented by heating the ink layer with infrared rays so as to facilitate penetration thereof into the film, and by heating the film after printing so as to facilitate oxidative polymerization. The ink layer 350 may include resin based on resin that absorbs a large amount of infrared rays, drying oil having many double bonds that undergo fast oxidative polymerization, and low-molecular solvent which has a relatively low boiling point, and which quickly infiltrates paper. For example, the ink layer 350 may include a polyester-based material and other additives. The additives may include an antifoaming agent which is added during printing and drying such that pores or pinholes are not left on the paint film, and a dispersing agent which improves wetting characteristics when pigment is dispersed in the resin and solvent, and which prevent re-coagulation of the dispersed pigment.

According to various embodiments, the ink layer 350 exhibits excellent bondability with a substrate, resistance to heat, durability (against high temperature, high pressure, and high humidity), and lower-film protection characteristics, and maintains a high transmittance even after high-temperature treatment such that the same can be usefully applied to form light-transmitting characteristics of the sensor portion according to the disclosure.

According to various embodiments, the ink layer 350 may include a first surface 350a facing in the first direction (+Z) and a second surface 350b facing in the second direction (−Z) that is opposite to the first direction (+Z). The first surface 350a may be disposed to contact at least a part of the multicoating layer 330 and the printed layer 340, and the second surface 350b may be disposed to face the at least one sensor 400.

According to various embodiments, the ink layer 350 may be provided to at least partially surround the sensor 400 and the printed layer 340, and may be disposed to face at least a part of the multicoating layer 330. For example, the first area P1 of the surface of the ink layer 350 facing in the first direction (+Z) may be disposed to contact the multicoating layer 330, and the second area P2 of the surface of the ink layer 350 facing in the first direction (+Z) may be disposed to contact the printed layer 340. As another example, the first area P1 of the surface of the ink layer 350 facing in the second direction (−Z) may be disposed to face the sensors.

According to various embodiments, the ink layer 350 may include a light path guide area S in the area facing the sensors. The light path guide area S may be formed to extend from the ink layer 350 and to protrude toward the first direction into the opening formed by the printed layer 340 such that the same transmits light in a predetermined wavelength band and transfers the same to the sensors.

According to various embodiments, the ink layer 350 can substantially reduce, compared with the prior art, the loss factor with regard to the transmittance in the ultraviolet area. For example, in connection with the loss factor related to the transmittance in the wavelength band of 760 nm to 1000 nm, conventional ink exhibited a loss factor of about 18.0%-20.0%, while the ink layer 350 according to the disclosure exhibited a loss factor of about 2.0%-3.0%. According to an embodiment of the disclosure, the transmittance of infrared rays having a wavelength of about 940 nm with regard to the ink layer 350 may be 95% or higher.

According to various embodiments, the loss factor of the ink layer 350 with regard to the transmittance in the visible ray band may be equal to that of the prior art or lower than the same. For example, the ink layer 350 exhibited a loss factor equal to or lower than that of conventional ink with regard to a transmittance in the wavelength band of 450 nm to 650 nm. According to an embodiment of the disclosure, the transmittance of visible rays having a wavelength of about 550 nm with regard to the ink layer 350 may be 85% or higher.

The ink layer 350 may be implemented to satisfy the transmittance required by the sensor 400 such that loss of light that has passed through the multicoating layer 330 can be minimized, and may protect the multicoating layer 330 including a metal component, thereby enhancing the durability of the transmissive film 300.

Hereinafter, processes of manufacturing the transmissive film 300 will be described.

Figure 6:
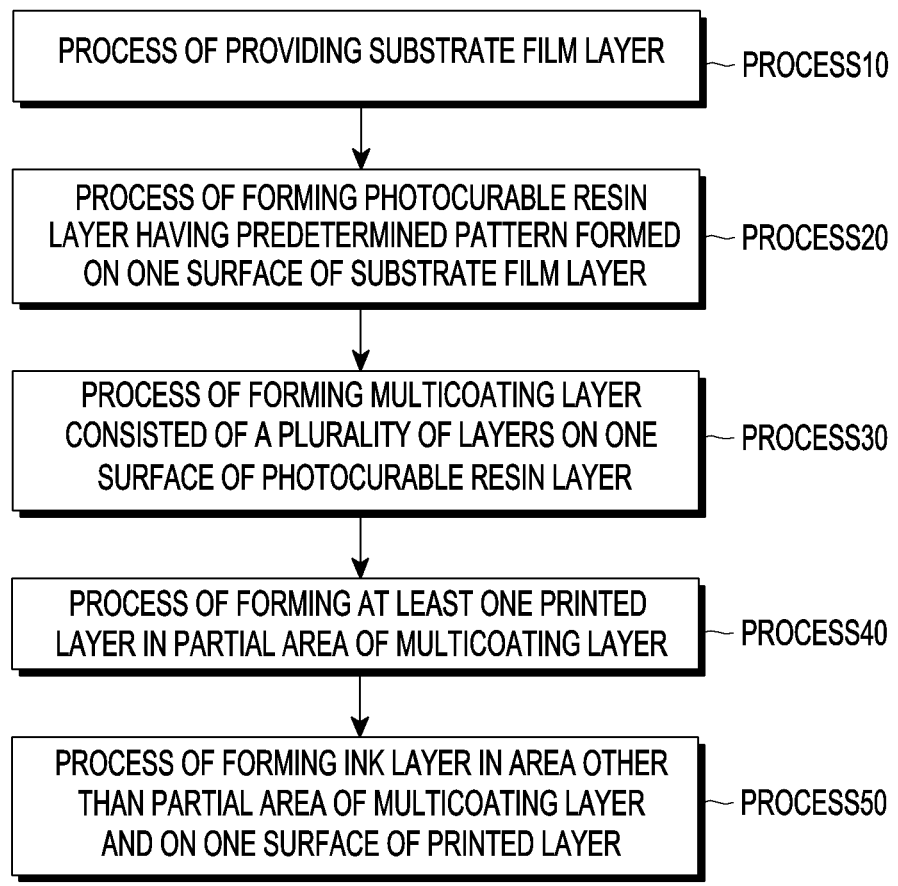
FIG. 6 is a flowchart regarding processes of laminating a light-transmitting film 300 of an electronic device 200 according to one of various embodiments of the disclosure.

FIG. 6 is a flowchart regarding processes of laminating a light-transmitting film 300 of an electronic device 200 according to one of various embodiments of the disclosure. The light-transmitting film 300 of the electronic device 200 illustrated in FIG. 6 may have the same structure as that of the light-transmitting film 204 or 300 of the electronic device 200 illustrated in FIG. 2 to FIG. 5.

According to various embodiments, the light-transmitting film 300 may be configured by laminating a plurality of layers between a transparent cover 203 and a sensor 400. The light-transmitting film 300 may include a substrate film layer 310, a photocurable resin film 320, a multicoating layer 330, a printed layer 342, and an ink layer 350 successively laminated/disposed toward the second direction (−Z).

Referring to FIG. 6, the substrate film layer 310 may be provided according to process 10. The substrate film layer 310 may be manufactured so as to include a material which has a high transmittance, and which is flexible. For example, the substrate film layer 310 may be made of a polymer film such as PET or a glass substrate. The substrate film layer 310 may be formed to have a thickness of 45 um-55 um.

Thereafter, a photocurable resin layer 320 may be formed on the provided substrate film layer 310 according to process 20. The photocurable resin layer 320 may be formed on a surface of the substrate film layer 310 facing in the second direction (−Z). The photocurable resin layer 320 may be manufactured by a photolithography method or an implant lithography method. However, the above methods are not limiting in any manner, and various widely-known methods may be used to form the photocurable resin layer.

According to various embodiments, the photocurable resin layer may be formed through a UV-based method, and may include a predetermined micropattern for expressing a stereoscopic color appearance exhibited by the multicoating layer 330 (described later). The photocurable resin layer 320 exhibits excellent bondability with a substrate, resistance to heat, durability, and lower-film protection characteristics, and maintains a high transmittance even after high-temperature treatment such that the same can be usefully applied to form a micropattern and a protective film.

After the photocurable resin layer 320 is formed, a multicoating layer 330 may be formed to include a plurality of layers according to process 30. The multicoating layer 330 may be formed on a surface of the photocurable resin layer 320 facing in the second direction (−Z).

According to various embodiments, the multicoating layer 330 may include at least two layers, and each layer may be made of a different material. For example, the multicoating layer 330 may include five layers, and each layer may be made of at least one of $SiO_2$, $Nb_2O_5$, $Ta_2O_5$, BST{(Ba,Sr)$TiO_3$}, PZT{Pb(Zr,Ti)$O_3$}, $Al_2O_3$, $HfO_2$, $ZrO_2$, $La_2O_3$, In, $TiO_2$, $Ti_3O_5$, aluminate, and silicate alloy.

According to various embodiments, the multicoating layer 330 may implement various colors expressed on the outer surface of the electronic device 200, and may cover the area in which the sensor 400 is disposed so as to implement a structure in which the sensor area is invisible to the user from the outside.

According to various embodiments, because no etching process is performed until the ink layer 350 is formed after the multicoating layer 330 has been formed, the multicoating layer 330 may form a single intact layer in the first area P1 without being damaged. Accordingly, indium among the metal components that constitute the multicoating layer 330 is protected by the ink layer such that the outer surface of the electronic device is not discolored. In addition, the multicoating layer 330 that implements a color is not damaged such that the at least one sensor 400 is invisible from outside the electronic device, thereby providing an aesthetic outer surface of the electronic device. Moreover, additional masking and delaminating processes for performing an etching process are unnecessary, thereby simplifying the processes.

After the multicoating layer 330 is formed, at least one printed layer 342 may be formed in a partial area of the multicoating layer 330 according to process 40. For example, the printed layer 340 may be formed such that the same is disposed in the area (second area P2) in which no sensor is disposed, and is disposed in the area (first area P1) in which sensors are disposed, and which instead has an opening.

According to various embodiments, the printed layer 340 may include at least two layers, and each layer may be made of a different material. For example, the printed layer 340 may include a first printed layer 341 and a second printed layer 342, and the first printed layer 341 and the second printed layer 342 may be disposed to be laminated on each other. According to an embodiment, the first printed layer 341 may be made of a material using black ink, and may be manufactured through a background printing process. The second printed layer 342 may be made of a material using blank ink, and may be manufactured through a shaded printing process. According to the arrangement of the printed layer 340, light reflected by the color expressed by the multicoating layer 330 does not propagate into the electronic device 200 but is directed in the outward direction, thereby preventing screen bleeding. As another example, according to the arrangement of the printed layer 340, a guide area may be provided such that light reaching the sensor is provided only in the sensor area.

After the printed layer 340 is laminated, an ink layer 350 may be formed on a partial surface of the first area P1 of the multicoating layer 330 and the second area P2 of the printed layer 340 according to process 50. The ink layer 350 may be formed on a surface of the multicoating layer 330 or the printed layer 342 facing in the second direction (−Z).

According to various embodiments, as a result of lamination of the multicoating layer 330 and the printed layer 340, a light path guide area S may be provided in such a structure/shape that the second area P2 is recessed or has a step-shaped opening. The ink layer 350 may be formed inside the light path guide area S, and the link layer 350 formed in the second area P2 may form a path along which light in a predetermined wavelength band propagates toward the sensor 400.

According to various embodiments, the ink layer 350 may include infrared dried ink, and may be implemented by heating the ink layer with infrared rays so as to facilitate penetration thereof into the film, and by heating the film after printing so as to facilitate oxidative polymerization. The ink layer 350 may include resin based on resin that absorbs a large amount of infrared rays, drying oil having many double bonds that undergo fast oxidative polymerization, and low-molecular solvent which has a relatively low boiling point, and which quickly infiltrates paper, as main components. For example, the ink layer 350 may include a polyester-based material and other additives.

According to various embodiments, the ink layer 350 may be made of a material capable of efficiently transmitting light in a predetermined wavelength band. For example, the transmittance of infrared rays having a wavelength of about 940 nm with regard to the ink layer 350 may be 95% or higher, and the transmittance of visible rays having a wavelength of about 550 nm with regard to the ink layer 350 may be 85% or higher.

After the ink layer 350 is laminated, an adhesive layer 301 may be formed on a partial surface of a partial area of the ink layer 350 and a partial area of the printed layer 340 according to process 60. For example, after the ink layer 350 is laminated so as to provide a light-transmitting film 300, an adhesive layer 301 may be applied to a surface of the light-transmitting film 300. The adhesive layer 301 is for the purpose of bonding with the transparent cover 203 and may be applied to the entire bezel area 203a of the transparent cover 203. Thereafter, a transparent cover 203 may be attached to a surface of the adhesive layer 301 facing in the second direction (−Z) according to process 70.

However, the above order is not limiting in any manner and, after applying an adhesive layer 301 to a surface of the transparent cover 203 facing in the second direction (−Z), a light-transmitting film 300 including the ink layer 350 may be disposed with the adhesive layer 301 interposed therebetween.

An electronic device according to various embodiments of the disclosure has a color implementation layer maintained intact in the front area of the electronic device, in which sensors are disposed, without etching the same such that sensor hole structures are invisible to the user's field of view from outside the electronic device, thereby providing an aesthetic design. In addition, the same implements a light-transmitting film including an ink layer that guarantees an optical transmittance required by sensors, thereby minimizing loss of light that reaches the sensors.

As described above, a light-transmitting film formed on an electronic device according to various embodiments of the disclosure may include: a flexible substrate film layer; a photocurable resin layer disposed on a surface of the substrate film layer, a predetermined pattern being formed on the photocurable resin layer; a multicoating layer disposed on a surface of the photocurable resin layer, which faces at least one sensor disposed inside the electronic device, the multicoating layer including a plurality of layers; at least one printed layer disposed on a surface of the multicoating layer, which forms a peripheral area of the at least one sensor; and an ink layer disposed on a surface of at least one of the multicoating layer and the printed layer, the ink layer having light-transmitting characteristics.

According to various embodiments, the ink layer may include a first surface facing in a first direction and a second surface facing in a second direction that is opposite to the first direction, the first surface may be disposed to contact at least a part of the multicoating layer and the printed layer and the second surface may be disposed to face the at least one sensor.

According to various embodiments, the transmittance of infrared rays having a wavelength of 760 nm to 1000 nm with regard to the ink layer may be 95% or higher.

According to various embodiments, the transmittance of visible rays having a wavelength of 450 nm to 650 nm with regard to the ink layer may be 85% or higher.

According to various embodiments, the ink layer may be manufactured to include polyester-based polymer material.

According to various embodiments, the ink layer may be disposed in at least a part of a first area in which the at least one sensor is located and a second area including an outer peripheral part of the first area; the first surface of the ink layer may be disposed to contact the at least one sensor; and the second surface of the ink layer may be formed to protrude in the first direction and disposed to contact a part of a surface of the multicoating layer.

According to various embodiments, light transferred to the at least one sensor may enter the light-transmitting film through a transparent cover of the electronic device, and may be transferred to the sensor through a light path guide area of the ink layer formed in the first area.

According to various embodiments, the ink layer may include light path guide area in the first area facing the sensor, and the light path guide area may be formed to extend from the ink layer and to protrude toward the first direction into an opening formed by the printed layer, and may transfer light in a predetermined wavelength band to the sensor by transmitting.

According to various embodiments, the multicoating layer may be configured to implement a color appearing on an outer surface of the electronic device, and a plurality of layers made of different materials may be laminated so as to implement the color.

According to various embodiments, each of the plurality of layers of the multicoating layer may be made of at least one of SiO2, Nb2O5, Ta2O5, BST{(Ba,Sr)TiO3}, PZT{Pb(Zr,Ti)O3}, Al2O3, HfO2, ZrO2, La2O3, In, TiO2, Ti3O5, aluminate, and silicate alloy.

According to various embodiments, the printed layer may include a plurality of layers including a light-blocking material; the printed layer may have an opening corresponding to the first area so as to form a path along which light propagates; and the entire area of the printed layer may be substantially disposed in the second area only.

According to various embodiments, the ink layer disposed inside the opening of the printed layer and disposed on the same plane with the printed layer may be disposed to contact the printed layer.

According to various embodiments, the photocurable resin layer may include an acrylate-based compound, and a nano micropattern may be formed on a surface of the photocurable resin layer so as to reflect light differently depending on the angle of view of a user to provide a stereoscopic appearance of the electronic device.

According to various embodiments, the at least one sensor mounted on the sensor portion may include at least one of a proximity sensor or a luminance sensor.

According to various embodiments, the at least one sensor may be configured to receive light in a wavelength band of 450 nm to 950 nm and to sense a distance of an object or an amount of light.

An electronic device according to various embodiments of the disclosure may include: a transparent cover including a view area configured to provide a screen to a user and a bezel area formed on a periphery of the view area, which forms at least partially a curved surface; a display device disposed in the view area of the transparent cover, which faces in a first direction; and a light-transmitting film disposed in the bezel area of the transparent cover so as to face in a second direction that is opposite to the first direction.

The light-transmitting film may include: a flexible substrate film layer disposed to face a surface of the bezel area; a photocurable resin layer disposed on a surface of the substrate film layer, a predetermined pattern being formed on the photocurable resin layer; a multicoating layer disposed on a surface of the photocurable resin layer, which faces at least one sensor disposed inside the electronic device, the multicoating layer is consisted of a plurality of layers; at least one printed layer disposed on at least one surface of the multicoating layer; and an ink layer disposed on a surface of at least one of the multicoating layer and the printed layer, the ink layer having light-transmitting characteristics.

According to various embodiments, an adhesive layer may be additionally disposed between the bezel area and the substrate film layer so as to bond the bezel area and the substrate film layer to each other.

The ink layer may be manufactured to include a polyester-based polymer material such that the transmittance of infrared rays having a wavelength of 760 nm to 1000 nm with regard to the ink layer may be 95% or higher.

A method for manufacturing an electronic device according to various embodiments of the disclosure may include the processes of: providing a substrate film layer; forming a photocurable resin layer having a predetermined pattern formed on a surface of the substrate film layer; forming a multicoating layer, including a plurality of layers, on a surface of the photocurable resin layer, which face a sensor disposed inside the electronic device; forming at least one printed layer in a partial area of the multicoating layer; and forming an ink layer in an area other than the partial area of the multicoating layer and on a surface of the printed layer.

According to various embodiments, in the process of forming an ink layer, the ink layer may be formed so as to extend into an opening area of the printed layer and to contact a surface of the multicoating layer, thereby forming a light path guide area.

The formed ink layer may be manufactured to include a polyester-based polymer material such that the transmittance of infrared rays having a wavelength of 760 nm to 1000 nm with regard to the ink layer may be 95% or higher.

According to various embodiments, the multicoating layer may implement a color appearing on the outer surface of the electronic device and may include a plurality of layers made of different materials in order to implement the color such that the at least one sensor is invisible from outside the electronic device.

While the disclosure has been shown and described with reference to certain embodiments thereof, it will be apparent to those skilled in the art that the camera lens module according to the disclosure is not limited to these embodiments, and various changes in form and details may be made therein without departing from the spirit and scope of the disclosure as defined by the appended claims.

The invention claimed is:

1. A light-transmitting film formed on an electronic device, the light-transmitting film comprising:
   a flexible substrate film layer;
   a photocurable resin layer disposed on a surface of the substrate film layer, a predetermined pattern being formed on the photocurable resin layer;
   a multicoating layer disposed on a surface of the photocurable resin layer, which faces at least one sensor disposed inside the electronic device, the multicoating layer comprising a plurality of layers;
   at least one printed layer disposed on a surface of the multicoating layer, which forms a peripheral area of the at least one sensor; and
   an ink layer disposed on at least one of the surface of the multicoating layer and a surface of the printed layer, the ink layer having light-transmitting characteristics.

2. The light-transmitting film of claim 1, wherein the ink layer comprises a first surface facing in a first direction and a second surface facing in a second direction that is opposite to the first direction, the first surface is disposed to contact at least a part of the multicoating layer and the printed layer and the second surface is disposed to face the at least one sensor.

3. The light-transmitting film of claim 2, wherein the transmittance of infrared rays having a wavelength of 760 nm to 1000 nm with regard to the ink layer is 95% or higher.

4. The light-transmitting film of claim 2, wherein the transmittance of visible rays having a wavelength of 450 nm to 650 nm with regard to the ink layer is 85% or higher.

5. The light-transmitting film of claim 2, wherein the ink layer is manufactured to comprise polyester-based polymer material.

6. The light-transmitting film of claim 2, wherein the ink layer is disposed in at least a part of a first area in which the at least one sensor is located and a second area comprising an outer peripheral part of the first area; the first surface of the ink layer is disposed to contact the at least one sensor; and the second surface of the ink layer is formed to protrude in the first direction and disposed to contact a part of a surface of the multicoating layer.

7. The light-transmitting film of claim 6, wherein light transferred to the at least one sensor enters the light-transmitting film through a transparent cover of the electronic device, and is transferred to the sensor through a light path guide area of the ink layer formed in the first area.

8. The light-transmitting film of claim 2, wherein the ink layer comprises a light path guide area in a first area facing the sensor, and the light path guide area is formed to extend from the ink layer and to protrude toward the first direction into an opening formed by the printed layer, which transfers light in a predetermined wavelength band to the sensor by transmitting.

9. The light-transmitting film of claim 2, wherein the multicoating layer is configured to implement a color appearing on an outer surface of the electronic device, and the plurality of layers are made of different materials laminated so as to implement the color.

10. The light-transmitting film of claim 9, wherein each of the plurality of layers of the multicoating layer is made of at least one of SiO2, Nb2O5, Ta2O5, BST{(Ba,Sr)TiO3}, PZT{Pb(Zr,Ti)O3}, Al2O3, HfO2, ZrO2, La2O3, In, TiO2, Ti3O5, aluminate, and silicate alloy.

11. The light-transmitting film of claim 6, wherein the printed layer comprises a plurality of layers comprising a light-blocking material; the printed layer has an opening corresponding to the first area so as to form a path along which light propagates; and an entire area of the printed layer is substantially disposed in the second area only.

12. The light-transmitting film of claim 11, wherein the ink layer disposed inside the opening of the printed layer and disposed on the same plane with the printed layer is disposed to contact the printed layer.

13. The light-transmitting film of claim 2, wherein the photocurable resin layer comprises an acrylate-based compound, and a nano micropattern is formed on the surface of the photocurable resin layer so as to reflect light differently depending on an angle of view of a user to provide a stereoscopic appearance of the electronic device.

14. The light-transmitting film of claim 2, wherein the at least one sensor comprises at least one of a proximity sensor or a luminance sensor, and is configured to receive light in a wavelength band of 450 nm to 950 nm and to sense a distance of an object or an amount of light.

15. An electronic device comprising:
a transparent cover comprising a view area configured to provide a screen to a user and a bezel area formed on a periphery of the view area, which forms at least partially a curved surface;
a display device disposed in the view area of the transparent cover, which faces in a first direction; and
a light-transmitting film disposed in the bezel area of the transparent cover, which faces in a second direction that is opposite to the first direction, wherein
the light-transmitting film comprises:
a flexible substrate film layer disposed to face a surface of the bezel area;
a photocurable resin layer disposed on a surface of the substrate film layer, a predetermined pattern being formed on the photocurable resin layer;
a multicoating layer disposed on a surface of the photocurable resin layer, which faces at least one sensor disposed inside the electronic device, the multicoating layer is consisted of a plurality of layers;
at least one printed layer disposed on at least one surface of the multicoating layer; and
an ink layer disposed on a surface of at least one of the multicoating layer and the printed layer, the ink layer having light-transmitting characteristics.

\* \* \* \* \*